United States Patent
Boyd, Jr. et al.

(10) Patent No.: US 12,074,052 B2
(45) Date of Patent: *Aug. 27, 2024

(54) FORMING MESAS ON AN ELECTROSTATIC CHUCK

(71) Applicant: Applied Materials, Inc., Santa Clara, CA (US)

(72) Inventors: Wendell Glenn Boyd, Jr., Morgan Hill, CA (US); Stanley Wu, San Ramon, CA (US); Matthew Boyd, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,931

(22) Filed: Jun. 7, 2023

(65) Prior Publication Data
US 2023/0326780 A1 Oct. 12, 2023

Related U.S. Application Data

(63) Continuation of application No. 17/183,179, filed on Feb. 23, 2021, now Pat. No. 11,699,611.

(51) Int. Cl.
 *H01L 21/683* (2006.01)
 *C23C 16/02* (2006.01)
 (Continued)

(52) U.S. Cl.
 CPC ...... *H01L 21/6833* (2013.01); *C23C 16/0227* (2013.01); *C23C 16/308* (2013.01); *C23C 16/4583* (2013.01)

(58) Field of Classification Search
 CPC ............. H01L 21/6833; C23C 16/0227; C23C 16/308; C23C 16/4583
 See application file for complete search history.

(56) References Cited

U.S. PATENT DOCUMENTS

| | | | |
|---|---|---|---|
| 5,841,624 A | * 11/1998 | Xu | .......... H02N 13/00 279/128 |
| 7,944,677 B2 | 5/2011 | Aruga et al. | |

(Continued)

FOREIGN PATENT DOCUMENTS

| | | |
|---|---|---|
| JP | 2007214540 A | 8/2007 |
| JP | 2009272646 A | 11/2009 |

(Continued)

OTHER PUBLICATIONS

International Search Report and Written Opinion dated Sep. 28, 2022 for Application No. PCT/US2022/013530.

(Continued)

*Primary Examiner* — Scott Bauer
(74) *Attorney, Agent, or Firm* — Patterson + Sheridan, LLP

(57) ABSTRACT

A body of an electrostatic chuck comprises mesas disposed on a polished surface of the body. Each of the mesas comprises an adhesion layer disposed on the polished surface of the body, a transition layer disposed over the adhesion layer, and a coating layer disposed over the transition layer. The coating layer has a hardness of at least 14 GPa. The body further comprises a sidewall coating disposed over a sidewall of the body. A method for preparing the body comprises polishing the surface of the body and cleaning the polished surface. The method further comprises depositing the mesas by depositing the adhesion layer on the body, the transition layer over the adhesion layer, and the coating layer over the transition layer. Further, the method includes, polishing the mesas.

20 Claims, 8 Drawing Sheets

(51) Int. Cl.
*C23C 16/30* (2006.01)
*C23C 16/458* (2006.01)

(56) References Cited

U.S. PATENT DOCUMENTS

| | | | |
|---|---|---|---|
| 8,390,980 | B2 | 3/2013 | Sansoni et al. |
| 9,001,489 | B2 | 4/2015 | Boyd, Jr. et al. |
| 9,669,653 | B2 | 6/2017 | Parkhe et al. |
| 9,685,356 | B2 | 6/2017 | Parkhe et al. |
| 10,074,552 | B2 | 9/2018 | Hayashi |
| 10,654,147 | B2 | 5/2020 | Boyd, Jr. et al. |
| 10,679,885 | B2 | 6/2020 | Boyd, Jr. et al. |
| 10,937,684 | B2* | 3/2021 | Horiuchi .............. B05D 7/52 |
| 11,086,233 | B2* | 8/2021 | Topping ............ H01L 21/68757 |
| 2004/0040665 | A1 | 3/2004 | Mizuno et al. |
| 2004/0114124 | A1* | 6/2004 | Hoeks .................... G03F 7/707 355/75 |
| 2005/0079737 | A1* | 4/2005 | Kellerman .......... H01L 21/6831 438/704 |
| 2005/0183669 | A1* | 8/2005 | Parkhe ................ H01L 21/6831 118/724 |
| 2006/0158823 | A1 | 7/2006 | Mizuno et al. |
| 2014/0118880 | A1 | 5/2014 | He et al. |
| 2015/0044947 | A1 | 2/2015 | Lu et al. |
| 2015/0059974 | A1 | 3/2015 | Boyd, Jr. et al. |
| 2017/0352566 | A1 | 12/2017 | Ramaswamy et al. |
| 2018/0301364 | A1 | 10/2018 | Boyd, Jr. et al. |

FOREIGN PATENT DOCUMENTS

| | | |
|---|---|---|
| JP | 2015507367 A | 3/2015 |
| JP | 2015162490 A | 9/2015 |
| JP | 2018536287 A | 12/2018 |
| KR | 20140114430 A | 9/2014 |
| KR | 20160022361 A | 2/2016 |
| TW | 201026632 A | 7/2010 |
| TW | 201417211 A | 5/2014 |
| WO | 2019184968 A1 | 10/2019 |

OTHER PUBLICATIONS

TW Office Action for Taiwan Patent Application No. 111103271 dated Jan. 12, 2024.

JP Office Action for Japanese Application No. 2023-504563 dated May 14, 2024.

KR Office Action dated Jun. 27, 2024, for Korean Patent Application No. 10-2023-7002021.

\* cited by examiner

FORMING MESAS ON AN ELECTROSTATIC CHUCK

CROSS-REFERENCE TO RELATED APPLICATIONS

This application is a continuation of, and claims the benefit of, U.S. patent application Ser. No. 17/183,179, filed Feb. 23, 2021, which is herein incorporated by reference in its entirety.

BACKGROUND

Field

Embodiments described herein generally relate to the manufacturing of articles used in semiconductor device manufacturing processes, in particular, to methods of manufacturing an electrostatic chuck (ESC) for use in a processing chamber.

Description of the Related Art

Electrostatic chucks (ESCs) are used in semiconductor manufacturing to securely hold a substrate in a processing position within a processing volume of a processing chamber. For example, a chucking electrode or electrodes within an ESC are driven within one or more voltages to generate a chucking force to hold a substrate to a surface of the ESC. The chucking force is a function of the potential between a voltage provided to the chucking electrode and the substrate.

A body of the ESC includes mesas that support a substrate during processing. The mesas (e.g., projections) create a distance between a surface of the body and a surface of the substrate to allow a backside gas to flow between the surface of the ESC and the substrate. The backside gas controls the thermal conductivity between the ESC and the substrate. Over time, the mesas wear down. As the mesas wear down, the distances between the substrate and the surface of the ESC is reduced. Further, the mesas may exhibit non-uniform wear, such that one or more mesas exhibits more wear than another one or more mesas. Accordingly the chucking force applied to the substrate may vary from substrate to substrate and/or across the surface of the substrate. Further, the temperature of a substrate may vary from substrate to substrate and/or across the surface of the substrate. The variation in chucking force and/or the variation in temperature may lead to defects within the processed substrate and corresponding semiconductor device. Defective substrates are discarded increasing the semiconductor device manufacturing costs by reducing yield of the processing chamber. ESCs exhibiting wear may be replaced with new or refurbished ESCs, however, when ESCs is replaced the corresponding processing chamber is taken offline, reducing the yield of a processing chamber, and increasing the cost associated with manufacturing semiconductor devices.

The standard refurbishment process is to remove the mesas and 5-50 microns of the dielectric material on a surface of the ESC and recreate the mesas. However, such a process makes the dielectric material of the ESC thinner, allowing it to be done only a couple of times. When the dielectric materials get too thin, high voltage punch through would occur, and the ESC is discarded, and a costly new ESC must be purchased.

Therefore, there is a need in the art for an improved method of forming mesas that exhibit less wear from substrate processing to increase the production yield and reduce the production cost of a processing chamber.

SUMMARY

In one example, a method for preparing a body of an electrostatic chuck comprising polishing a surface of the body and cleaning the polished surface of the body. The method further comprising depositing first mesas on the polished surface of the body. Depositing the first mesas comprises depositing an adhesion layer on the polished surface of the body, depositing a transition layer over the adhesion layer, and depositing a coating layer over the transition layer. The coating layer has a hardness of at least 14 GPa. The method further comprises polishing the first mesas to smooth a surface of the first mesas.

In another example, a body of an electrostatic chuck comprises mesas disposed on a polished surface of the body. Each of the mesas comprises an adhesion layer disposed on the polished surface of the body, a transition layer disposed over the adhesion layer, and a coating layer disposed over the transition layer. The coating layer has a hardness of at least 14 GPa. The body further comprises a sidewall coating disposed over a sidewall of the body.

In another example, an electrostatic chuck comprises a body and a base. The body comprises mesas disposed on a polished surface of the body. Each of the mesas comprises an adhesion layer disposed on the polished surface of the body, a transition layer disposed over the adhesion layer, and a coating layer disposed over the transition layer. The coating layer has a hardness of at least 14 GPa. The base further comprises a sidewall coating disposed over a sidewall of the body. The base is attached to the body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to manufacturing and/or refurbishing electrostatic chucks (ESCs).

The ESCs support substrates within a semiconductor processing chamber while processing the substrate.

Conventionally, a patterned surface of an ESC is formed using a negative masking (or bead blasting) processes. In a negative masking process the surface of the ESC is bead blasted through openings in a patterned mask to generate elevated features and recessed portions of the surface of the ESC. The elevated features have pronounced sharp edges that require rounding and/or deburring prior to installing the substrate support in a processing chamber. Further, the materials used to construct the elevated feature are susceptible to wear, causing the corresponding ESC to be removed from a processing chamber to be refurbished. Further, as the elevated features are generated by bead blasting, material on a surface of the ESC is removed to form the elevated features and recessed regions. However, overtime, a surface of the ESC may not support the use of bead blasting to form the elevated features and recessed regions due to wear. Such ESCs may not be refurbished and are discarded. Refurbishing ESCs increases the downtime of a processing chamber and discarding ESCs increases the operating cost of a processing chamber, increasing the cost of manufacturing corresponding semiconductor devices.

The following describes an improved ESC and method of forming the elevated features to increase the operating time of an ESC (e.g., the amount of time between when an ESC needs to be refurbished) and increases the number of times an ESC can be refurbished. For example, the elevated features are formed through a deposition process and have an increased hardness as compared to other ESCs. Accordingly, the improved ESC decreases operating costs of a processing chamber by decreasing the downtime and reducing the number of ESCs that are discard.

Figure 1:
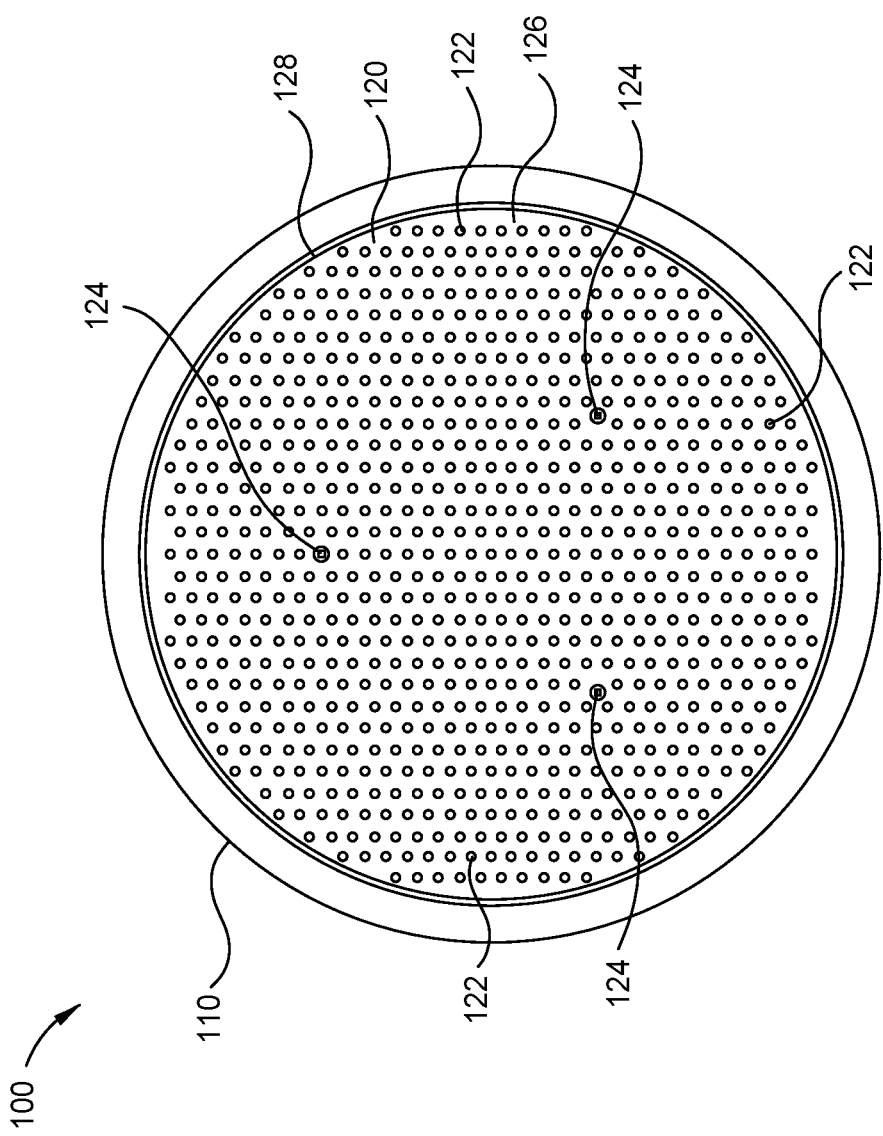
FIG. 1 is a top view of an electrostatic chuck, according to one or more embodiments.

FIG. 1 is a top view of an ESC 100, according to one or more embodiments. The ESC 100 includes a base 110 and a body 120. The base 110 is attached to the body 120. The body 120 has a disc-like shape with an annular periphery that substantially matches the shape and size of a substrate (a wafer) positioned thereon. The body 120 comprises a gas retention ring 128, mesas 122 and lift pin passages (e.g., holes or apertures) 124. The body 120 further comprises gas passages (not shown), such as grooves, that are formed in the body 120 and are fluidly coupled to a source of a backside gas. The backside gas may be helium, He, or other gases. The backside gas may be provided into the gas passages to enhance the heat transfer between the body 120 and a substrate through a plurality of backside gas conduits. The gas retention ring 128 may be on the annular periphery of the body 120 and provides a seal between the substrate and body 120 to prevent the backside gas from escaping into the interior volume of a processing chamber.

The body 120 is fabricated from a ceramic material. Suitable examples of the ceramic materials include aluminum oxide ($Al_2O_3$), aluminum nitride (AlN), titanium oxide (TiO), titanium nitride (TiN), and silicon carbide (SiC), among others. In one example, the body 120 is fabricated from a ceramic material containing a rare earth metal. In another example, the body 120 is fabricated from or coated with $Y_2O_3$.

Figure 2:
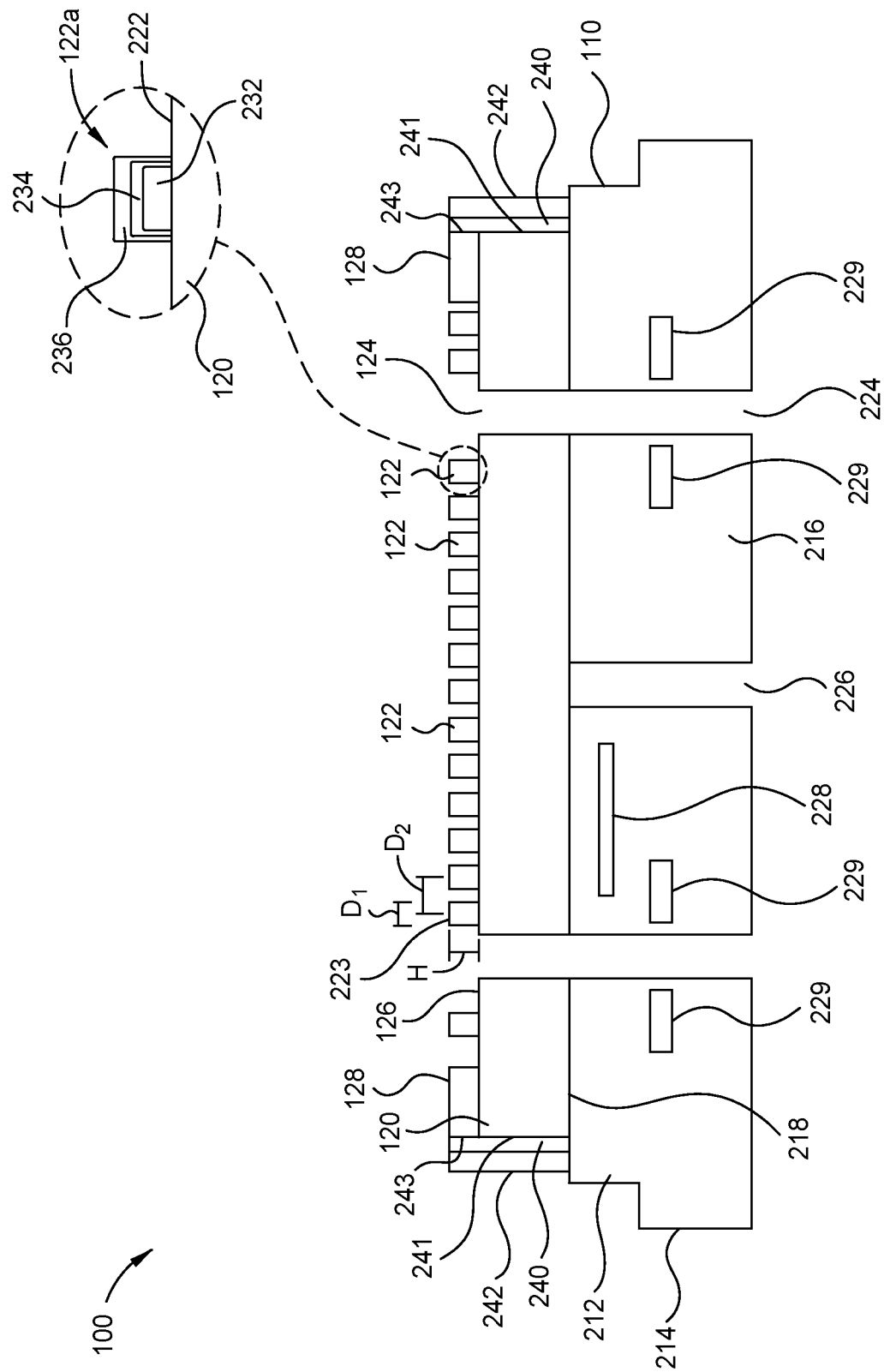
FIG. 2 is a side view of an electrostatic chuck, according to one or more embodiments.

FIG. 2 is a schematic side view of the ESC 100. As is illustrated in FIG. 2, the sealing band (e.g., a gas retention ring) 128 is formed on a surface 126 of the body 120. The mesas (e.g. protrusions) 122 are formed on the surface 126 of the body 120. The gas retention ring 128 extends from the surface 126 and encircles the area of the body 120 including where the mesas 122 are disposed. Two or more of the mesas 122, the gas retention ring 128, and the body 120 comprise a common material or materials. Alternatively, one or more the mesas 122, the gas retention ring 128, and the body 120 may comprise different materials.

The mesas 122 are cylindrical shaped with a flat or domed surface 223. During processing, a substrate (e.g., the substrate 315 of FIG. 3) is supported by the surface 223 of the mesas 122. The mesas 122 have a diameter $D_1$ of between about 500 μm and about 6 mm, a center to center (CTC) spacing $D_2$ of between about 5 mm and about 30 mm, and a height H of between about 3 μm and about 100 μm. For example, the height H is between about 3 μm and about 80 μm, between about 3 μm and about 72 μm, between about 3 μm and 50 μm, or more than about 3 μm. In another example, the mesas 122 have a diameter D1 that is less than about 500 μm or greater than about 6 mm. Further, in one example, the height H is less than about 3 μm or greater than about 80 μm.

When not formed homogenously with the body 120, each of the mesas 122 is comprised of a common one or more layers. For example, each of the mesas 122 includes layers 232-236. The mesa 122a is representative example of each of the mesas 122. The mesa 122a includes an adhesion layer 232, a transition layer 234, and a coating layer 236. The adhesion layer 232 is disposed on the surface 126 of the body 120. The transition layer 234 is disposed over the adhesion layer. The coating layer 236 is disposed over the transition layer 234. During substrate processing, the substrate (e.g., the substrate 315 of FIG. 3) is supported by and contacts the coating layer 236.

The adhesion layer 232 is comprised of an aluminum or erbium layer. In other examples, the adhesion layer may be comprised of other metal materials and/or metal containing materials. The height (e.g., distance from the surface 126) is about 0.1 μm to about 1 μm. Further the width of the adhesion layer 232 is about 0.50 μm to about 5.5 mm. The adhesion layer 232 increases the adhesion strength of the coating layer 236 to the body 110. In one example, the adhesion layer 232 increases the adhesion strength of the coating layer 236 to the body 110 formed of $Al_2O_3$.

The transition layer 234 is comprised of an oxide material. For example, the transition layer 234 is comprised of aluminum oxynitride (AlON). Alternatively, the transition layer 234 is comprised of erbium oxynitride (ErON). In other examples, the transition layer is comprised of other oxides and/or other materials. The height of the transition layer 234 is about 0.1 μm to about 1 μm from the surface of the adhesion layer 232. The width of the transition layer 234 is about 0.50 μm to about 6 mm. The transition layer 234 provides a transition between the material of the adhesion layer 232 and the coating layer 236, improving the adhesion of the coating layer 236 to the body 110. The transition layer 234 is disposed over the adhesion layer 232. In one example, the transition layer 234 is at least partially disposed on the surface 126 of the body 120.

The coating layer 236 is comprised of an oxynitride material. The coating layer 236 is comprised of an oxynitride material comprising about ten percent oxygen and about ninety percent nitrogen. In one example, the coating layer 236 is comprised of an aluminum oxynitride (AlON) or erbium oxynitride (ErON). For example, the coating layer 236 is comprised of an AlON or ErON material comprising more than or less than about 20 percent oxygen, more than or less than about 25 percent nitrogen, and more than or less than 49 percent of Al or Er by Rutherford backscattering spectrometry (RBS) analysis. In one example, the coating layer is comprised of an oxynitride containing about 20 percent to about 40 percent oxygen, about 30 percent to about 50 percent nitrogen, and the remaining portion comprised of Al or Er, as measured by energy dispersive X-Ray analysis (EDX). Increasing the nitrogen within the oxynitride material increases the hardness of the coating layer 236.

The coating layer 236 has a hardness of at least about 10 gigapascals (GPa). In one example, the coating layer 236 has a hardness of at least 14 GPa. In another example, the coating layer 236 has a hardness of at least about 20 GPa. In another example, the coating layer 236 has a hardness of at least 22 GPa. In one example, the coating layer 236 has a hardness of at least 24 GPa. Further, in one example, the coating layer 236 has a hardness of at least 25 GPa or 30 GPa.

The height of the coating layer 236 is about 3 μm to about 70 μm from the surface of the transition layer 234. The width of the coating layer 236 is about 500 μm to about 5 mm. The coating layer 236 is disposed over the transition layer 234. Further, in one example, the coating layer 236 is at least partially disposed on the surface 126 of the body 120. A substrate (e.g., the substrate 315) is supported by (e.g., sits on) the coating layer 236 during processing. The hardness of the coating layer 236 reduces the effects of processing plasmas and other chemicals utilized to process the substrate. Accordingly, bodies (e.g., the body 120) including the coating layer 236 experience less wear as compared to bodies not including the coating layer 236, and are used for a longer period of time between refurbishments. Further, the processing chambers (e.g., the processing chamber 300) including bodies having the coating layer 236 have less down time as compared to processing chambers that do not include bodies that have the coating layer 236.

The material makeup of the transition layer 234 is based on the material makeup of the coating layer 236. For example, in embodiments where the coating layer 236 is comprised of AlON, the transition layer 234 is comprised of AlO. Further, in embodiments where the coating layer 236 is comprised of ErON, the transition layer is comprised of ErO.

The body 120 includes a sidewall 241. The sidewall 241 includes non-chamfered edges. In other examples, one or more edges of the sidewall 241 is chamfered. A ring gasket 242 is disposed around the sidewall 241. The ring gasket 242 is comprised of silicon or other similar materials. A sidewall coating 240 is disposed on the sidewall 241 and between the sidewall 241 and the ring gasket 242. The sidewall coating 240 is disposed on at least a portion of the sidewall 241. In one example, the sidewall coating 240 is disposed on less than all of the sidewall 241. Further, the sidewall coating 240 is disposed on at least a portion of edge 243 of the gas retention ring 128. In one example, the sidewall coating 240 is disposed on the sidewall 241 and not the edge 243 of the gas retention ring 128. Further, the ring gasket 242 is disposed along the edge 243 of the gas retention ring 128. The sidewall coating 240 has a radius in the range of about 0.01 inches to about 0.05 inches. In one example, the sidewall coating 240 has a radius of about 0.02 inches or 0.03 inches. In another example, the sidewall coating 240 is disposed on at least a portion of the angular flange 212 and/or 214.

The sidewall coating 240 comprises ErON. In other examples, the sidewall coating 240 is comprised of a material other than ErON, for example AlON. The sidewall coating 240 reduces the effects (e.g., erosion of the sidewall material) of processing plasmas and other chemicals utilized to process the substrate on the sidewall 241. In one or more examples, aluminum contamination of a processed substrate may occur due to erosion of the sidewall 241. Accordingly, bodies including the sidewall coating 240 experience less wear as compared to bodies that do not include the sidewall coating 240, and are used for a longer period of time between refurbishment processes. Further, contamination of processed substrates is reduced increasing the yield of the corresponding processing chamber.

With further reference to FIG. 1, the base 110 has a disc-like main portion (e.g., main portion 212 of FIG. 2) and an annular flange (e.g., annular flange 214 of FIG. 2) extending outwardly from a main portion (e.g., main portion 216 of FIG. 2) and is attached below the body 120. The base 110 is fabricated from a material having thermal properties substantially matching that of the body 120. For example, the base 110 is fabricated from a metal, such as aluminum or stainless steel or other suitable materials. Alternatively, the base 110 may be fabricated from a composite of ceramic and metal material. The base 110 has a thermal expansion coefficient that is substantially matched to the body 120 to reduce a mismatch of thermal expansion and mitigate warping of the electrostatic chuck 100 or separation between the base 110 and the body 120 during substrate processing.

With reference to FIG. 2, the base 110 is coupled to the body 120 by a bonding material 218. The bonding material 218 bonds the base 110 with the body 120 and facilitates thermal energy exchange between the body 120 and the base 110. Further, the bonding material 218 reduces thermal expansion mismatch between body 120 and the base 110. In one example, the bonding material 218 mechanically bonds the base 110 to the body 120. In another example, the bonding material 218 is a thermal conductive paste or tape. In still another example, the bonding material 218 is a silicon-based or acrylic-based material.

The base 110 further includes lift pin passages 224, backside gas passage 226, chucking electrode 228, and cooling conduits (e.g., cooling channels) 229. The lift pin passages 224 correspond to the lift pin passages 124. The backside gas passage 226 provides a backside gas to the conduits and passageways within the body 120. While a single chucking electrode 228 is shown in FIG. 2, in other examples, the base 110 includes two or more chucking electrodes. Cooling fluid is provided to the cooling channels 229 to aid in the temperature control of a substrate during substrate processing.

Figure 3:
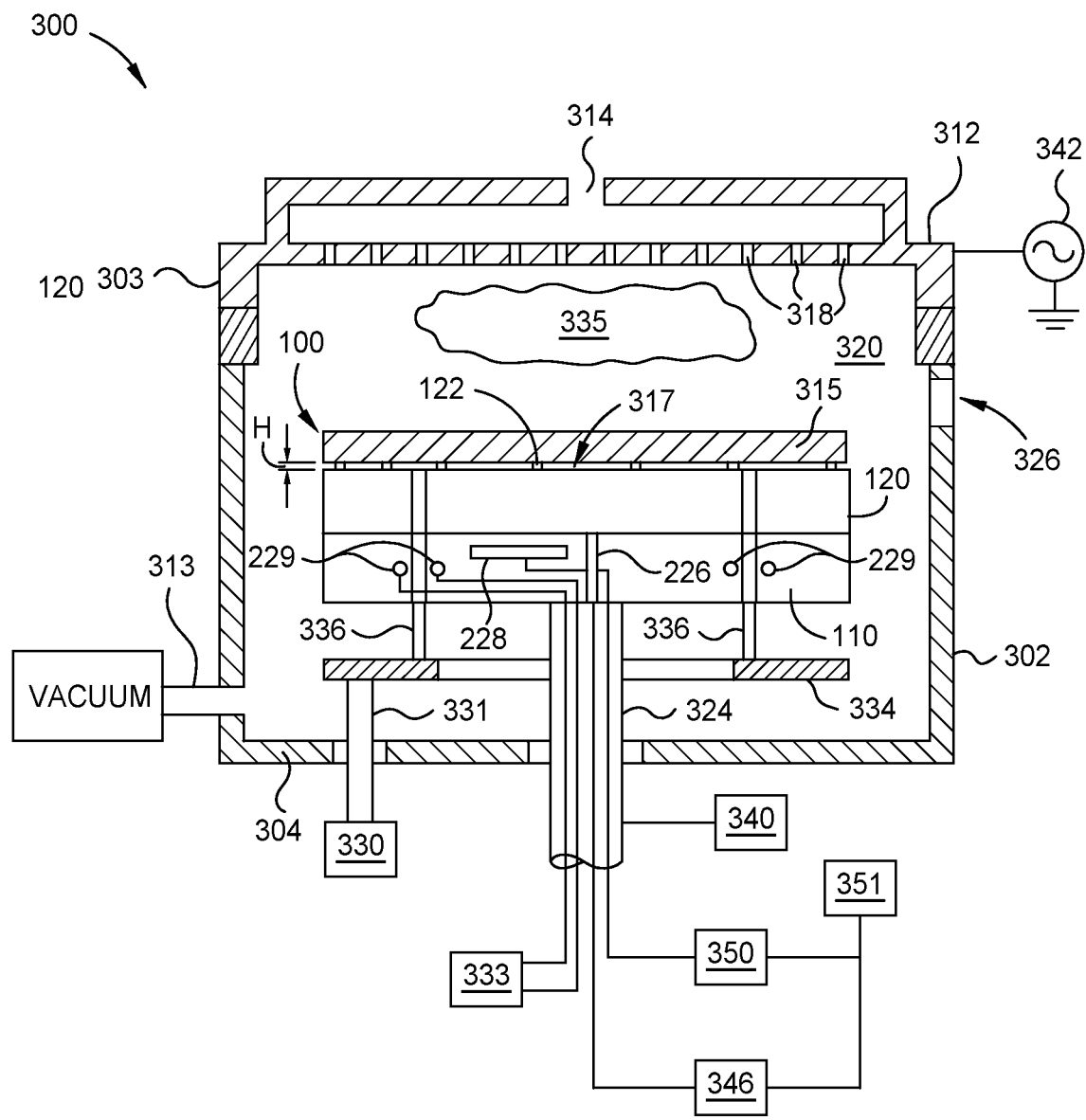
FIG. 3 is a side view of a processing chamber, according to one or more embodiments.

FIG. 3 is a schematic sectional view of a processing chamber 300 with a substrate support comprising the ESC 100 disposed therein. The processing chamber 300 is a plasma processing chamber, such as a plasma etch chamber, a plasma-enhanced deposition chamber, for example a plasma-enhanced chemical vapor deposition (PECVD) chamber or a plasma-enhanced atomic layer deposition (PEALD) chamber, a plasma treatment chamber, or a plasma based ion implant chamber, for example a plasma doping (PLAD) chamber. However, the ESC 100 described herein can be used with other processing chambers or processing systems that use substrate supports having a patterned surface that includes elevated features and recessed surfaces.

In the example of FIG. 3, the processing chamber 300 described is a schematic representation of a CVD processing chamber, and it includes a chamber lid 303, one or more sidewalls 302, and a chamber bottom 304 which define a processing volume 320. A gas distributer 312 (e.g., a showerhead), having a plurality of openings 318 disposed therethrough, is disposed in the chamber lid 303 and is used to uniformly distribute processing gases from a gas inlet 314 into the processing volume 320. The gas distributer 312 is coupled to a first power supply 342, such as an RF or VHF power supply, which supplies the power to ignite and maintain a processing plasma 335 composed of the processing gases through capacitive coupling. The processing volume 320 is fluidly coupled to a chamber exhaust, such as to one or more dedicated vacuum pumps, through a vacuum outlet 313 which maintains the processing volume 320 at sub-atmospheric conditions and evacuates processing and other gases therefrom. The ESC 100 is disposed on a support shaft 324 within the processing volume 320. The support shaft 324 sealingly extends through the chamber bottom 304. A controller 340 controls a lift, such as a linear motor, stepper motor and gears, or other mechanism, to control raising and lowering of the support shaft 324, and the ESC 100 disposed thereon, to facilitate placement of, and removal of, the substrate 315 with respect to the processing volume 320 of the processing chamber 300.

The substrate 315 is loaded into, and removed from, the processing volume 320 through an opening 326 in one of the one or more sidewalls 302, which is conventionally sealed with a door or a valve (not shown) during substrate 315 processing. A plurality of lift pins 336 disposed above, but engageable with, a support 334 are movably disposed through the lift pin passages 124 and 224 within the ESC 100 to facilitate transferring of the substrate 315 onto and off of the ESC 100. The support 334 is coupled to shaft 331. The shaft 331 sealingly extends through the chamber bottom 304. The shaft 331 raises and lowers the support 334 by means of an actuator 330. When the support 334 is in a raised position, the plurality of lift pins 336 are contacted from below and moved to extend above the mesas 122, lifting the substrate 315 therefrom and enabling access to the substrate 315 by a robot handler. When the support 334 is in a lowered position the plurality of lift pins 336 are flush with, or below, the mesas 122 and the substrate rests on the mesas 122.

As illustrated in FIG. 3, the cooling channels 229 are fluidly coupled to, and in fluid communication with, a coolant source 333, such as a refrigerant source or water source. In such a configuration, the base 110 regulates the temperature of the body 120 and the substrate 315. The chucking electrode 228 is driven with a chucking voltage to secure the substrate 315 to the body 120. Driving the chucking electrode 228 provides a voltage potential between the substrate 315 and the chucking electrode 228. The voltage potential between the substrate 315 and the chucking electrode 228 results in an electrostatic chucking force between the electrode 228 and the substrate 315. The chucking electrode 228 is electrically connected to a power supply 350 which provides the chucking voltage or voltages to the chucking electrode 228. The chucking voltages are between about −5000V and about +5000V.

A backside volume 317 is formed between recessed surfaces (e.g., areas between the mesas 122) of the body 120 and the substrate 315. For example, when the substrate 315 is supported by the body 120, the substrate 315 is supported by the mesas 122 and the recessed surfaces are between the mesas 122. An inert thermally conductive backside gas, e.g., He or other similar gas, is provided to the backside volume 317 through the backside gas passage 226 within the body 120 that is fluidly connected to the backside gas supply 346. A controller 351 is used to maintain the gas pressure in the backside volume 317 during plasma processing of the substrate 315.

After processing one or more substrates, one or more of the mesas 122 experiences wear based on the chemicals and/or plasma utilized during substrate processing. For example, the height H of one or more of the mesas 122 decreases due to the wear. Decreasing the height H of one or more mesas 122, decreases a corresponding distance between the substrate 315 and the surface 126. Further, the height H of two or more of the mesas 122 may differ from each other. Accordingly, processing of the substrate 315 may experience defects as the processing is not uniform across the surface of the substrate 315. For example, a first portion of the substrate 315 may experience an increased temperature as compared to a second portion of the substrate 315 due to a difference in height of the mesas 122. The areas of increased temperatures negatively affect the processing of the substrate 315 such that material thickness across the surface of the substrate is not uniform. As the height of one or more mesas 122 decreases based on the chemicals and/or plasma utilized during processing of the substrate 315, the distance between the substrate 315 and the body 120 decreases. The substrate 315 experiences increased chucking voltages as the height H of the mesas 122 decreases. Accordingly, a processed substrate may have one or more defects due to the change in chucking voltages. As the height H of the mesas 122 decreases, defects are present within a processed substrate. Accordingly, defected substrates are discarding, reducing the yield of the processing chamber 300. Reducing the yield of the processing chamber 300, increases the semiconductor manufacturing costs.

To reduce defects within substrates, a worn ESC (e.g., an ESC having mesa with a reduced height H) is removed from the processing chamber 300 and replaced. To keep production costs down, the bodies of the ESC are refurbished instead of being discarded. Refurbishing the bodies includes removing the mesas 122 and any material deposited on the surface 126 during substrate processing, cleaning the surface, polishing the surface, and depositing new mesas 122. The refurbishing process is described in further detail with regard to method 600 of FIG. 6.

The mesas 122 are deposited on new or refurbished bodies 120. For example, the mesas 122 are deposited using a using a mask 400. The mask 400 includes mesa apertures (e.g., holes) 410 and lift pin apertures (e.g., holes) 412. Each of the mesa apertures 410 corresponds to a mesa (e.g., the mesas 122) that is deposited on the body 120. Each of the lift pin apertures 412 corresponds to a respective lift pin passage 124 of the body 120. In one example, the mask 400 includes three or more lift pin apertures 412. In another example, the mask 400 includes two or more lift pin apertures 412.

Figure 5:
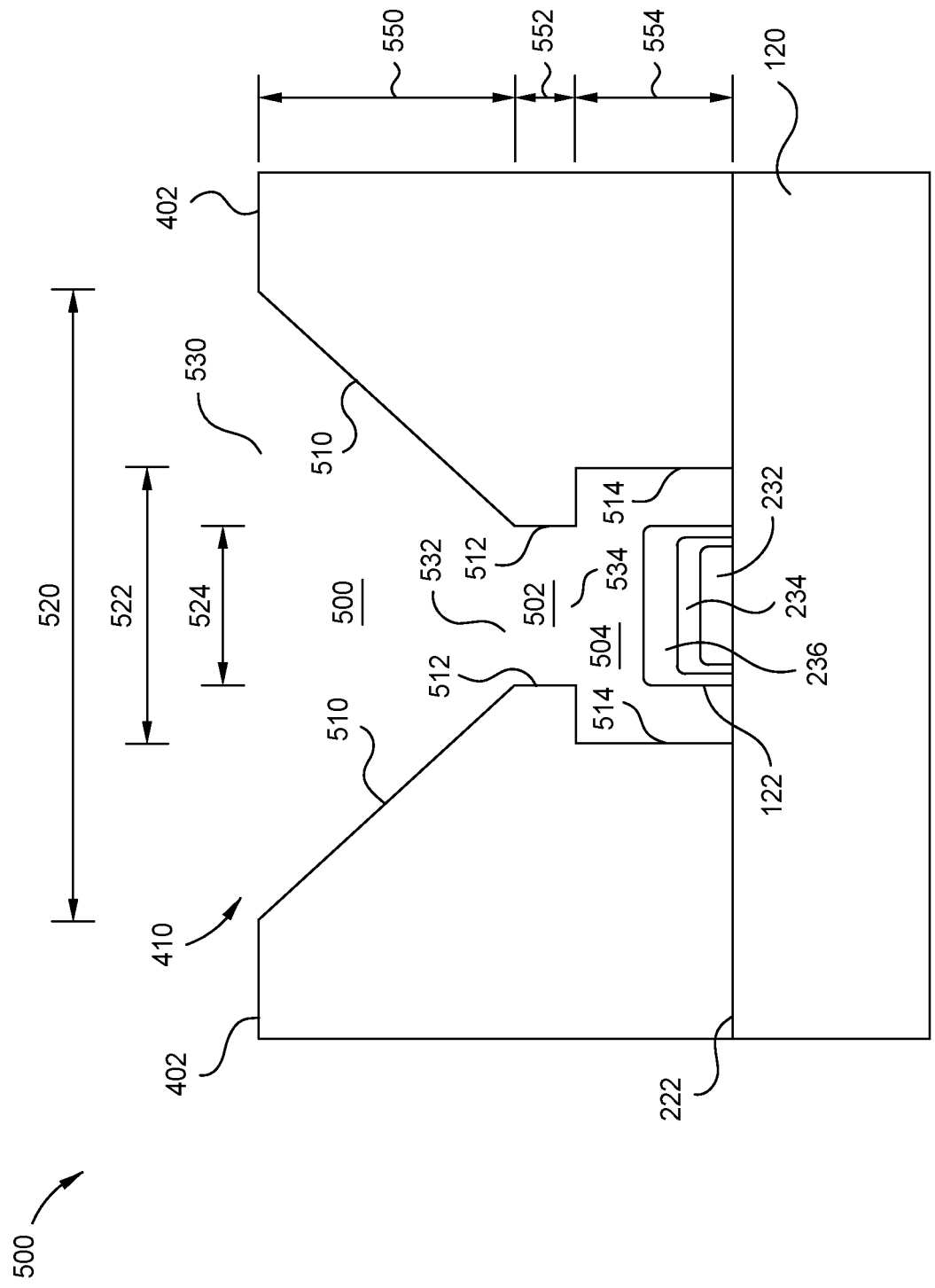
FIG. 5 is side view of a portion of a mask, according to one or more embodiments.

FIG. 5 illustrates a portion of the mask 400, according to one or more examples. Specifically, FIG. 5 illustrates the mesa aperture 410, according to one or more examples. The mesa aperture 410 includes an upper portion 500, a middle portion 502, and a lower portion 504. The middle portion 502 is between the upper portion 500 and the lower portion 504.

The upper portion 500 is between the surface 402 and the middle portion 502. The upper portion 500 includes sidewall 510. The sidewall 510 is at a first angle with the surface 402. For example, an opening 530 in the surface 402 and corresponding to the upper portion 500 has a width 520 that is greater than a width 524 of an opening 532 between the upper portion 500 and the middle portion 502. The angle of the sidewall 510 relative to the surface 402 is less than ninety degrees. For example, the angle of the sidewall 510 relative to the surface 402 is in a range of about 70 degrees to about 85 degrees. However, in other embodiments, the angle of the sidewall 510 relative to the surface 402 is less than about 70 degrees or greater than about 85 degrees. Further, the width of the opening 532 is in a range of about 2 mm to about 3 mm. In one example, the width of the opening 532 is about 2.4 mm. Further, the upper portion 500 has a height 550. The height 550 is in a range of about 2 mm to about 3 mm. In one example, the height 550 is about 2.5 mm or about 2.56 mm.

The middle portion 502 includes sidewall 512. The sidewall 512 is substantially perpendicular to the surface 402. Further, the angle of the sidewall 512 relative to the surface 402 is greater than the angle of the sidewall 510 relative to the surface 402. The width 524 of the middle portion 502 is substantially constant. The width 524 of the middle portion 502 is less than the width 520 of the opening 530. The width 524 is in a range of about 1.5 mm to about 3 mm. In one example, the width is about 2.4 mm. Further, the middle portion 502 has a height 552. The height 552 is in a range of about 0.2 mm to about 0.4 mm. In one example, the height is about 0.32 mm. Further, the height 552 is less than the height 550. The lower portion 504 is between the middle portion 502 and the surface 126 of the body 120 and the middle portion 502. The lower portion 504 includes sidewall 514. The angle of the sidewall 514 relative to the surface 402 is greater than the angle of the sidewall 510 relative to the surface 402. For example, the sidewall 514 is perpendicular to the surface 402. In other examples, the sidewall 514 may be at an angle that is less than or greater than ninety degrees relative to the surface 402. The width of the opening 534 between the middle portion 502 and the lower portion 504 is the same as the width of the opening 532. For example, the opening 532 and the opening 534 have the width 524. In other examples, the width of the opening 534 is greater than or less than the width of the opening 532. The lower portion 504 has a width 522 that is greater than the width of the opening 534. For example, the width 522 is in a range of about 2 mm to about 4 mm. In one example, the width 522 is about 3 mm. In other examples, the width 522 of the lower portion 504 is the same as the width 524 of the opening 534. The lower portion 504 has a height 554. The height 554 is greater than the height 552. Alternatively, the height 554 is equal to or less than the height 552. The height 554 is less than the height 550. Alternatively, the height 554 is equal to or less than the height 550. In one example, the height 554 is in a range of about 0.1 mm to about 0.25 mm. In one example, the height 554 is 0.17 mm. In another example, the height 554 is about 0.2 mm.

Figure 4A:
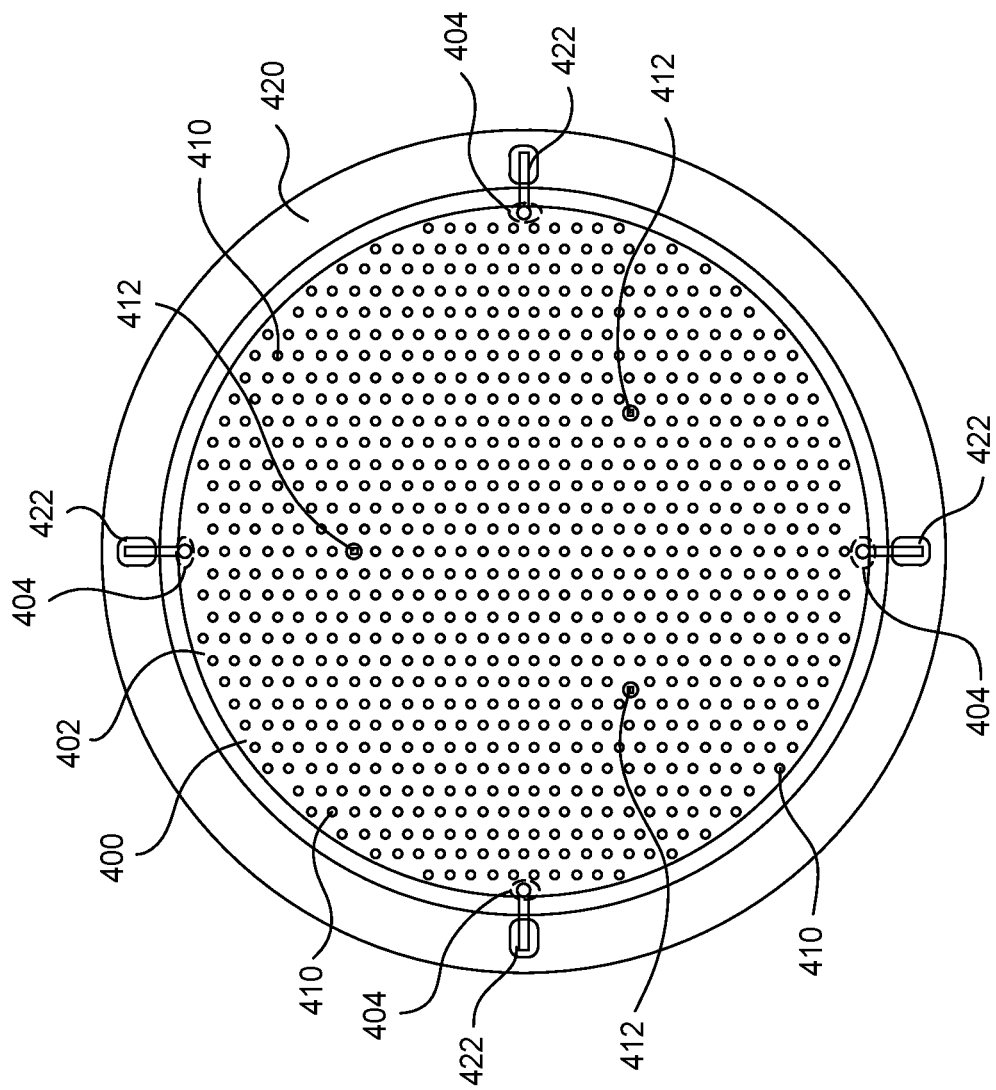
FIG. 4A is a top view of a mask and a mounting ring, according to one or more embodiments.

With further reference to FIG. 4A, the mask 400 is surrounded by a mounting ring 420. The mounting ring 420 maintains the position of the mask 400 relative to the body 120 during deposition of the mesas 122. For example, the mounting ring 420 includes retainers 422. The retainers 422 are attached to the mounting ring 420 and moved to contact the surface 402 of the mask 400. The retainers 422 exert a force against the surface 402 of the mask 400 to maintain the position of the mask 400 relative to the body 120. The mounting ring 420 includes two or more retainers 422. The mounting ring 420 includes four or more retainers 422. Alternatively, the mounting ring 420 includes two or more retainers 422.

The mask 400 includes areas 404 where the mask 400 is contacted by the retainers 422 such that the retainers 422 do not interfere with the formation of the mesas 122. The location of the areas 404 correspond to the location of the retainers 422 of the mounting ring 420. Further, the mounting ring 420 is spaced apart from the mask 410. A connection is formed between the mounting ring 420 and the mask 410 via the retainers 422.

Figure 4B:
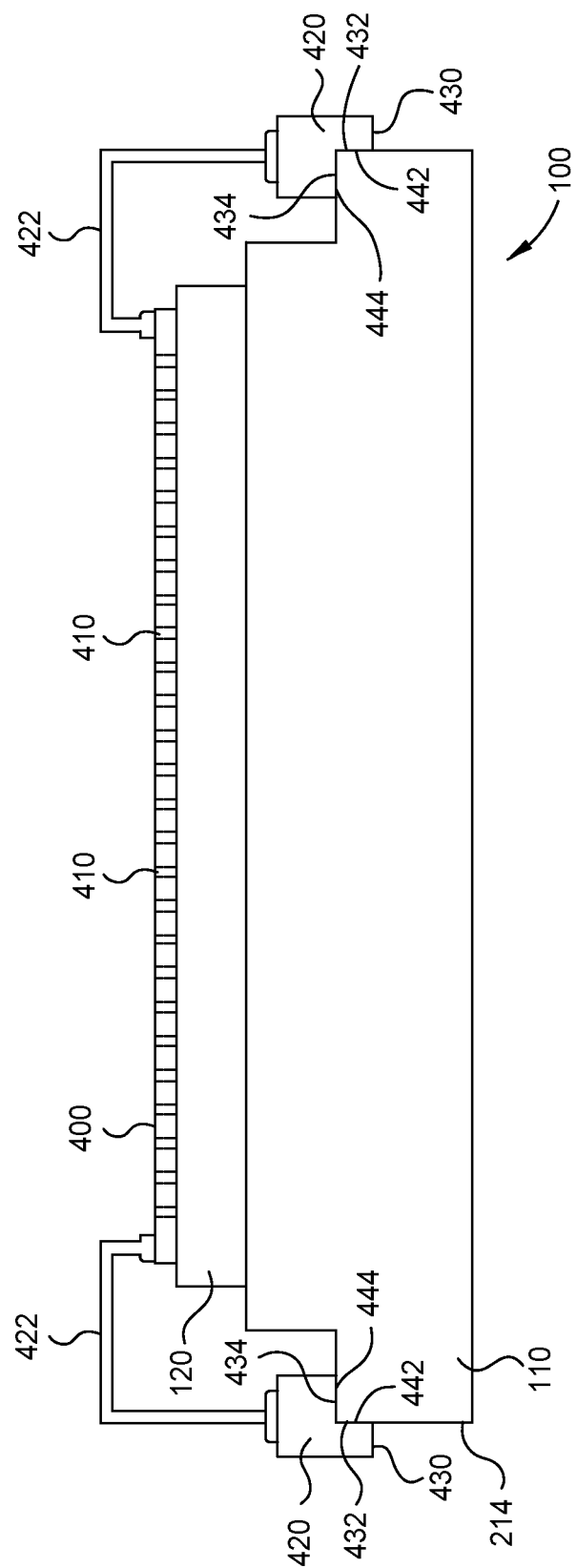
FIG. 4B is a side view of a mask, a mounting ring, and an electrostatic chuck, according to one or more embodiments.

As illustrated in FIG. 4B, the mounting ring 420 includes a retaining feature 430 (e.g., a lip feature) that is mounted to the annular flange 214. For example, the retaining feature 430 includes a surface 432 that contacts a surface 442 of the angular flange 214 and a surface 434 that contacts a surface 444 of the angular flange 214. The retaining feature 430 and the retainers 422 of the mounting ring 420 maintain the position of the mask 400 relative to the body 120. For example, the retaining feature 430 maintains the position of the mounting ring 420 relative to the base 110. When in contact with the mask 400, the retainers 422 maintain the position of the mask 400 relative to the mounting ring 420 and the body 120. Accordingly, during processing (e.g., formation of the mesas 122), the mask 400 does not move relative to the body 120.

Figure 6:
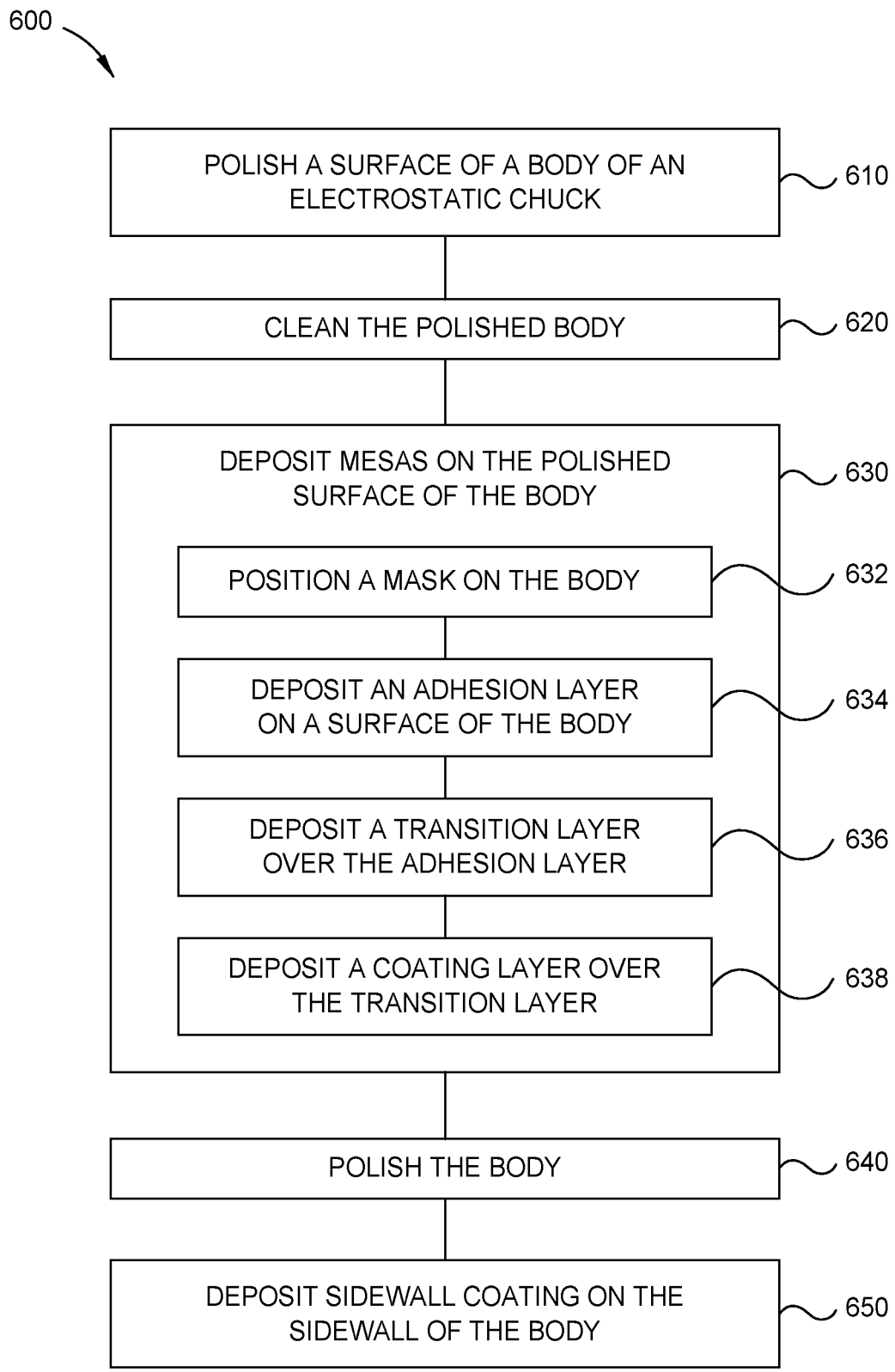
FIG. 6 is a flow chart of a method for forming mesas on an electrostatic chuck, according to one or more embodiments.

FIG. 6 illustrates a flowchart of a method 600 for depositing mesas (e.g., the mesas 122) on a body (e.g., the body 120), corresponding to one or more embodiments. At block 610, the surface 126 of the body 120 is polished. For example, the surface 126 of the body 120 is polished by a polishing system that includes one or more polishing pads mounted on one or more platens. A platen is rotated to rotate a corresponding polishing pad mounted to the platen while the surface 126 of the body 120 is pressed against the polishing pad. Further, a polishing fluid is applied to the polishing pad while the polishing pad is rotated and in contact with the surface 126. The polishing fluid comprises an abrasive dispersed in a water soluble carrier fluid. For example, the polishing fluid includes a diamond abrasive, an oxide abrasive, or other abrasive material. The surface 126 of the body 120 is placed in contact with the polishing pad to polish the surface 126. For example, the polishing pad is moved toward the surface 126 or the surface 126 is moved toward the polishing pad such that the polishing pad contacts the surface 126.

At block 610, the surface 126 of the body 120 is polished such that the surface 126 has a roughness of less than or equal to an average surface roughness, Ra, of about 4 μm. In another example, the surface 126 is polished such that the surface 126 has an Ra of less than or equal to about 2 μm. In other example, the surface 126 is polished such that the surface 126 has an Ra of less than about 4 μm.

At block 620, the polished body (e.g., the body 120) is cleaned. For example, at least the polished surface (e.g., the polished surface 126) of the body 120 is cleaned. The polished surface 126 is cleaned with a sponge. Additionally, or alternatively, the polished surface 126 is cleaned with a 600 grit dressing stick until the remnants of the surface polishing is removed. Further, the polished surface 126 is wiped dry with clean room wipes. The backside gas conduits of the body 120 may be flushed within deionized water and dried to remove polishing fluid from the backside gas conduits of the body 120.

At block 630, the mesas 122 are deposited on the surface 126 of the body 120. For example, the mesas 122 are deposited on the surface 126 of the body 120 using the mask 400.

The operations at block 630 may include one or more operations at blocks 632, 634, 636, 638. For example, block 630 for depositing the mesas 122 on the surface 126 includes, at block 632, positioning the mask 400 on the body 120. The mounting ring 420 is positioned around the body 120 and the retainers 422 are placed against the surface 402 of mask to minimize movement of the mask 400 relative to the body 120. The mounting ring 420 may contact a portion of the base 110. The body 120, including the mask 400 mounted thereto, is transferred to a processing chamber to deposit a first layer on the surface 126 of the body 120. The processing chamber is configured to deposit one or more materials onto the surface 126 to form the mesas 122. Further, processing chamber may be configured similar to that of the processing chamber 300. In other embodiments, the processing chamber is different form the processing chamber 300.

At block 634, to deposit the mesas 122 on the surface 126 of the body 120, an adhesion layer (e.g., the adhesion layer 232) is deposited on the surface 126 of the body 120. The adhesion layer 232 is comprised of aluminum and/or other metals. At block 636, to deposit the mesas 122 on the surface 126 of the body 120, a transition layer (e.g., the transition layer 234) is deposited over the adhesion layer 232. Further, at least a portion of the transition layer 234 is deposited on the surface 126 of the body 120. The transition layer 234 is comprised of AlON, ErON, or other oxynitride containing materials. The transition layer 234 may be comprised of an oxynitride material similar to that of the coating layer 236. The transition layer 234 may be deposited in the same processing chamber as utilized to deposit the adhesion layer 232 or in a different processing chamber from that utilized to deposit the adhesion layer 232.

At block 638, a coating layer (e.g., the coating layer 236) is deposited over the transition layer 234. The coating layer 236 may also be partially deposited on the surface 126 of the body 120. The coating layer 236 is comprised of an oxynitride. For example, the coating layer 236 is comprised of AlON or ErON. Further, the coating layer has a hardness of at least about 14 GPa, at least about 20 GPa, at least 22 GPa, or at least 24 GPa. The coating layer 236 may be deposited in the same processing chamber as utilized to deposit the transition layer 234 and/or the adhesion layer 232 or in a different processing chamber from that utilized to deposit the transition layer 234 and/or the adhesion layer 232.

At block 640, the mesas 122 and the surface 126 of the body 120 are polished. The body 120 is polished to remove extraneous particles from the mesas 122. Removing extraneous particles from the mesas 122 creates a flat surface for a substrate (e.g., the substrate 315) to be mounted on during processing and reduces possible contamination during processing. The hardness of the polishing pad and abrasiveness of the polishing fluid are selected to minimize damage to the coating layer 236. In one example, the polishing pad and/or polishing fluid used during 640 of the method 600 are similar to the polishing pad and/or polishing fluid used during block 610 of the method 600. Alternatively, the roughness of the polishing pad is greater than or less than the roughness of the polishing pad used during block 610 of the method 600. Further, abrasiveness of the polishing fluid is greater than or less than the abrasiveness of the polishing fluid used during block 610 of the method 600.

At block 650, a sidewall coating (e.g., the sidewall coating 240) is deposited on the sidewall 241 of the body 120. The sidewall coating 240 is comprised of erbium (ErON). In other examples, the sidewall coating is comprised of a material other than ErON. The sidewall coating 240 may be deposited in the same processing chamber as utilized to deposit the coating layer 236, the transition layer 234 and/or the adhesion layer 232 or in a different processing chamber from that utilized to deposit the coating layer 236, the transition layer 234 and/or the adhesion layer 233. In one example, the sidewall coating 240 is deposited during a period of time overlapping with when the adhesion layer 232, the transition layer 234, and/or the coating layer 236 is deposited. In one example, the sidewall coating 240 is deposited concurrently with when the adhesion layer 232, the transition layer 234, and/or the coating layer 236 is deposited. In one example, the sidewall coating 240 is deposited during a period of time overlapping with when the coating layer 236 is deposited. In another example, the sidewall coating 240 is deposited before the mesas 122 are deposited or after the mesas 122 are deposited. In one example, the sidewall coating 240 is deposited after the coating layer is deposited at block 638 and before the body 120 is polished at 640. Alternatively, the sidewall coating 240 is deposited after the body is polished at 640.

In one or more examples, the materials deposited while forming the mesas 122 forms a liner in the lift pin passages 124. The liner in the lift pin passages 124 aids in sealing lift pins within the lift pin passages 124 and preventing processing gas from entering the lift pin passages 124 during substrate processing.

Figure 7:
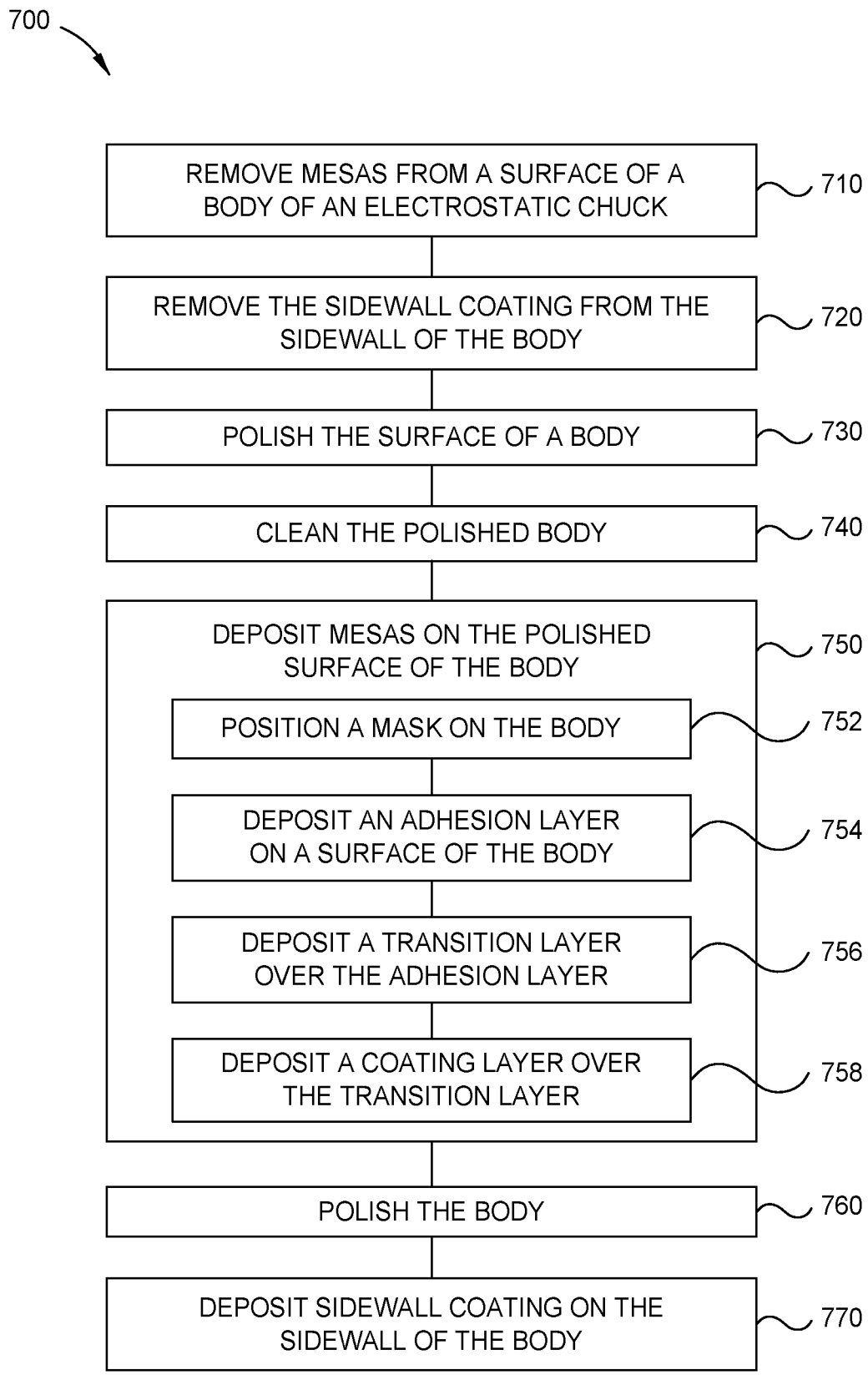
FIG. 7 is a flow chart of a method for refurbishing an electrostatic chuck, according to one or more embodiments.

FIG. 7 illustrates a flowchart of a method 700 for refurbishing a body (e.g., the body 120), according to one or more embodiments. The body 120 may be refurbished after a determination that one or more of the mesas 122 have experienced deterioration due to a plasma and/or other chemicals used to process the substrate 315. For example, the body 120 may be refurbished after a predetermined number of substrate processing cycles, a predetermined amount of time, a detection of a deterioration of one or more of the mesas, and/or detection of defects within a processed substrate. At block 710, the mesas (e.g., the mesas 122) are removed from the surface (e.g., the surface 126) of a body (e.g., the body 120). The mesas 122 are ground off the surface 126 of the body 120. For example, the mesas 122 are ground off using a grinding pad. Alternatively, or additionally, the mesas 122 are chemically removed by a chemical etching process. The chemical etching process removes the mesas 122 without removing any dielectric material of the body 120. Accordingly, as the material thickness of the body 120 is not affected, the chucking forces generated during substrate process are not changed. At block 720, the sidewall coating (e.g., the sidewall coating 240) is removed from the sidewall (e.g., the sidewall 241) of the body 120. For example, the sidewall coating 240 is removed by abrasively removing, for example by bead or abrasive blasting or grinding, the sidewall coating 240 off the sidewall coating 240. In other examples, the sidewall coating 240 is removed chemically with a chemical etching process. As is noted above, the chemical etching process removes the sidewall coating 240 without removing any dielectric material of the body 120. Accordingly, as the material thickness of the body 120 is not affected, the chucking forces generated during substrate process are not changed.

At block 730, the surface 126 of the body 120 is polished such that the surface 126 has an Ra of less than or equal to about 4 μm. In another example, the surface 126 is polished such that the surface 126 has a roughness of less than or equal to about 2 Ra. In other example, the surface 126 is polished such that the surface 126 has a roughness greater than 4 Ra. The operation of block 730 is similar to operation of block 610 of method 600.

At block 740, the polished body (e.g., the body 120) is cleaned. For example, the polished surface (e.g., the polished surface 126) of the body 120 is cleaned. The polished surface 126 is cleaned with a sponge. Additionally, or alternatively, the polished surface 126 is cleaned with a 600 grit dressing stick until the remnants of the surface polishing is removed. Further, the polished surface 126 is wiped dry with clean room wipes. The backside gas conduits of the body 120 may be flushed within deionized water and dried. The operation of block 740 is similar to operation of block 620 of method 600.

At block 750, the mesas 122 are deposited on the surface 126 of the body 120. For example, the mesas 122 are deposited on the surface 126 of the body 120 using the mask 400.

The operations at block 750 may include one or more operations at blocks 752, 754, 756, 758. For example, the operation at block 750 of depositing the mesas 122 on the surface 126 includes, at block 752, positioning the mask 400 on the body 120. The mounting ring 420 is positioned around the body 120 and the retainers 422 are placed against the surface 402 of mask to minimize movement of the mask 400 relative to the body 120. The mounting ring 420 may contact a portion of the base 110. The body 120, including the mask 400 mounted thereto, is transferred to a processing chamber to deposit a first layer on the surface 126 of the body 120. The processing chamber is configured to deposit one or more materials onto the surface 126 to form the mesas 122. Further, processing chamber may be configured similar to that of the processing chamber 300. In other embodiments, the processing chamber is different form the processing chamber 300. The operation of block 750 is similar to operation of block 630 of method 600.

At block 754, to deposit the mesas 122 on the surface 126 of the body 120, an adhesion layer (e.g., the adhesion layer 232) is deposited on the surface 126 of the body 120. The adhesion layer 232 is comprised of aluminum and/or other metals. At block 756, to deposit the mesas 122 on the surface 126 of the body 120, a transition layer (e.g., the transition layer 234) is deposited over the adhesion layer 232. Further, the transition layer 234 is deposited on the surface 126 of the body 120. The transition layer 234 is comprised of AlON, ErON, or other oxide containing materials. The transition layer 234 may be comprised of an oxide material similar to that of the coating layer 236. The transition layer 234 may be deposited in the same processing chamber as utilized to deposit the adhesion layer 232 or in a different processing chamber from that utilized to deposit the adhesion layer 233.

At block 758, a coating layer (e.g., the coating layer 236) is deposited over the transition layer 234. The coating layer 236 may also be partially deposited on the surface 126 of the body 120. The coating layer 236 is comprised of an oxynitride. For example, the coating layer 236 is comprised of AlON or ErON. Further, the coating layer 236 has a hardness of at least about 14 GPa, at least about 20 GPa, at least 22 GPa, or at least 24 GPa. The coating layer 236 may be deposited in the same processing chamber as utilized to deposit the transition layer 234 and/or the adhesion layer 232 or in a different processing chamber from that utilized to deposit the transition layer 234 and/or the adhesion layer 233.

At block 760, the mesas 122 and the surface 126 of the body 120 are polished. The body 120 is polished to remove extraneous particles from the mesas 122. Removing extraneous particles from the mesas 122 creates a flat surface for a substrate (e.g., the substrate 315) to be mounted on during process. The hardness of the polishing pad and abrasiveness of the polishing fluid are selected to minimize damage to the coating layer 236. In one example, the polishing pad and polishing fluid used during block 760 of the method 700 are similar to the polishing pad and polishing fluid used during block 730 of the method 700. Alternatively, the roughness of the polishing pad is greater than or less than the roughness of the polishing pad used during block 730 of the method 700. Further, abrasiveness of the polishing fluid is greater than or less than the abrasiveness of the polishing fluid used during block 730 of the method 700. The operation of block 760 is similar to operation of block 640 of method 600.

At block 770, a sidewall coating (e.g., the sidewall coating 240) is deposited on the sidewall 241 of the body 120. The sidewall coating 240 is comprised of ErON. The sidewall coating 240 may be deposited in the same processing chamber as utilized to deposit the coating layer 236, the transition layer 234 and/or the adhesion layer 232, or in a different processing chamber from that utilized to deposit the coating layer 236, the transition layer 234 and/or the adhesion layer 233. The sidewall coating 240 is deposited before the mesas 122 are deposited or after the mesas 122 are deposited. For example, the sidewall coating 240 is deposited after the coating layer 236 is deposited at block 758 and before the body 120 is polished at block 760. Alternatively, the sidewall coating 240 is deposited after the body is polished at block 760.

At the completion of method 600 and/or method 700, the ESC 100 including the mesas 122 is positioned in a processing chamber 300. For example, the ESC 100 is positioned on the support shaft 324.

While the foregoing is directed to embodiments of the present disclosure, other and further embodiments of the disclosure may be devised without departing from the basic scope thereof, and the scope thereof is determined by the claims that follow.

What is claimed is:

1. A method for preparing a body of an electrostatic chuck, the method comprising:
   polishing a surface of the body to create a polished surface;
   cleaning the polished surface of the body;
   depositing mesas on the polished surface of the body, wherein each mesa comprises:
      an adhesion layer on the polished surface of the body;
      a transition layer over the adhesion layer; and
      a coating layer over the transition layer; and
   polishing the mesas.

2. The method of claim 1, wherein the adhesion layer is metallic.

3. The method of claim 2, wherein the adhesion layer is comprised of aluminum or erbium.

4. The method of claim 1, wherein the transition layer is comprised of an oxide material.

5. The method of claim 1, wherein at least a portion of the transition layer is deposited onto the polished surface of the body.

6. The method of claim 1, wherein the coating layer is comprised of an oxynitride material having about 20 percent to about 40 percent oxygen.

7. The method of claim 1, wherein the coating layer is comprised of an oxynitride material having less than 20 percent oxygen.

8. The method of claim 7, wherein the oxynitride material having less than 20 percent oxygen is aluminum oxynitride or erbium oxynitride.

9. A body of an electrostatic chuck, the body comprising:
mesas disposed on a polished surface of the body, each mesa comprising:
an adhesion layer disposed on the polished surface of the body;
a transition layer disposed over the adhesion layer; and
a coating layer disposed over the transition layer; and
a sidewall coating disposed over a sidewall of the body.

10. The body of claim 9, wherein the adhesion layer is metallic.

11. The body of claim 10, wherein the adhesion layer is comprised of aluminum or erbium.

12. The body of claim 9, wherein:
the transition layer is comprised of an oxide material including a metal; and
the coating layer is comprised of an oxynitride material including the metal.

13. The body of claim 12, wherein the metal is aluminum or erbium.

14. The body of claim 9, wherein the coating layer is comprised of an oxynitride material having about 20 percent to about 40 percent oxygen.

15. The body of claim 9, wherein the coating layer is comprised of an oxynitride material having less than 20 percent oxygen.

16. The body of claim 15, wherein the oxynitride material having less than 20 percent oxygen is aluminum oxynitride or erbium oxynitride.

17. An electrostatic chuck comprising:
a body comprising:
mesas disposed on a polished surface of the body, each mesa comprising:
an adhesion layer disposed on the polished surface of the body;
a transition layer disposed over the adhesion layer; and
a coating layer disposed over the transition layer; and
a sidewall coating disposed over a sidewall of the body; and
a base attached to the body.

18. The electrostatic chuck of claim 17, wherein the coating layer is comprised of an oxynitride material having about 20 percent to about 40 percent oxygen.

19. The electrostatic chuck of claim 17, wherein the coating layer is comprised of an oxynitride material having less than 20 percent oxygen.

20. The electrostatic chuck of claim 19, wherein the oxynitride material having less than 20 percent oxygen is aluminum oxynitride or erbium oxynitride.

* * * * *